(12) United States Patent
Kim et al.

(10) Patent No.: US 8,885,357 B2
(45) Date of Patent: Nov. 11, 2014

(54) PRINTED CIRCUIT BOARD WITH REDUCED CROSS-TALK

(75) Inventors: Hyunjun Kim, Mercer Island, WA (US); Jeffrey S. Conger, Eau Claire, WI (US); Gregory E. Scott, Snohomish, WA (US)

(73) Assignee: Cray Inc., Seattle, WA (US)

( * ) Notice: Subject to any disclaimer, the term of this patent is extended or adjusted under 35 U.S.C. 154(b) by 379 days.

(21) Appl. No.: 13/345,247

(22) Filed: Jan. 6, 2012

(65) Prior Publication Data

US 2013/0175077 A1     Jul. 11, 2013

(51) Int. Cl.
*H05K 1/11*     (2006.01)
*H05K 1/14*     (2006.01)

(52) U.S. Cl.
USPC ............ 361/792; 361/760; 361/803; 174/262

(58) Field of Classification Search
USPC .............. 361/792, 803, 760; 333/33; 174/262
See application file for complete search history.

(56) References Cited

U.S. PATENT DOCUMENTS

| | | | |
|---|---|---|---|
| 4,954,929 A | 9/1990 | Baran | |
| 5,400,039 A | 3/1995 | Araki et al. | |
| 5,834,160 A * | 11/1998 | Ferry et al. | 430/313 |
| 6,175,088 B1 | 1/2001 | Saccocio | |
| 6,388,890 B1 | 5/2002 | Kwong et al. | |
| 7,154,356 B2 | 12/2006 | Brunette et al. | |
| 2006/0125573 A1 * | 6/2006 | Brunette et al. | 333/33 |

OTHER PUBLICATIONS

"QSH/QTH High Speed Socket 0.5 mm pitch," Samtec Product Specification, Jun. 19, 2008, 8 pp.
International Search Report and Written Opinion for International Application No. PCT/US2012/063044, Mail Date Jan. 22, 2013, 8 pages.
International Preliminary Report on Patentability for International Application No. PCT/US2012/063044, Mail Date Nov. 27, 2013, 18 pages.

* cited by examiner

*Primary Examiner* — Andargie M Aychillhum
(74) *Attorney, Agent, or Firm* — Perkins Coie LLP

(57) ABSTRACT

A multi-layer printed circuit board has a number of landing pads that are configured to engage a connector secured thereto. Between the landing pads associated with different signals is at least one micro via that is electrically connected to a ground plane on an outer surface of the multi-layer printed circuit board, and a ground plane on an inner layer of the multi-layer printed circuit board.

7 Claims, 3 Drawing Sheets

PRINTED CIRCUIT BOARD WITH REDUCED CROSS-TALK

STATEMENT REGARDING FEDERALLY SPONSORED RESEARCH

This invention was made with United States Government support under Agreement No. HR0011-07-9-0001 awarded by DARPA. The Government has certain rights in the invention.

TECHNICAL FIELD

The technology disclosed herein relates to printed circuit boards in general, and in particular to, printed circuit boards with structures for reducing cross-talk between signal traces.

BACKGROUND

As circuit board densities and clock speeds increase, the electromagnetic fields between signals routed on a printed circuit board interfere with signals transmitted on nearby leads. This cross-talk increases the signal to noise ratio of the signals, which in turn lessens the ability of different circuit components to communicate with each other.

One technique that has been used to reduce cross-talk between traces on a printed circuit board is to place ground planes in one or more areas and/or different layers of the printed circuit board. These ground planes may be connected with one or more grounding vias, (i.e., small conductive tunnels that extend though the various layers of the printed circuit board). While the ground planes and ground vias do aid in reducing cross-talk between the signal traces, it is desirable to further reduce cross-talk whenever possible.

DETAILED DESCRIPTION

As will be explained in further detail below, the technology disclosed herein relates to multi-layer printed circuit boards, and in particular to structures for reducing cross-talk between signal traces in a multi-layer circuit board.

Disclosed herein is a design for a printed circuit board that includes features to further reduce cross-talk that occurs in the area of conductive landing pads that engage a circuit board connector. In particular, a multi-layer printed circuit board includes one or more landing pads on an outer layer that are configured to make electrical contact with a connector. Between the landing pads that are associated with different signals are one or more "micro" vias. In one embodiment, each micro via is electrically connected to a ground plane on an outer layer of the printed circuit board and a ground plane on an inner layer of the printed circuit board.

In one disclosed embodiment, signals in the printed circuit board are carried on differential signal traces such that each signal to be transmitted to the connector is associated with two conductive landing pads. One or more micro vias are positioned between adjacent contact landing pads associated with different signals.

In one embodiment, the micro vias are placed symmetrically between the conductive landing pads of the printed circuit board. In another embodiment, the micro vias are asymmetrically placed between the conductive landing pads.

Figure 1:
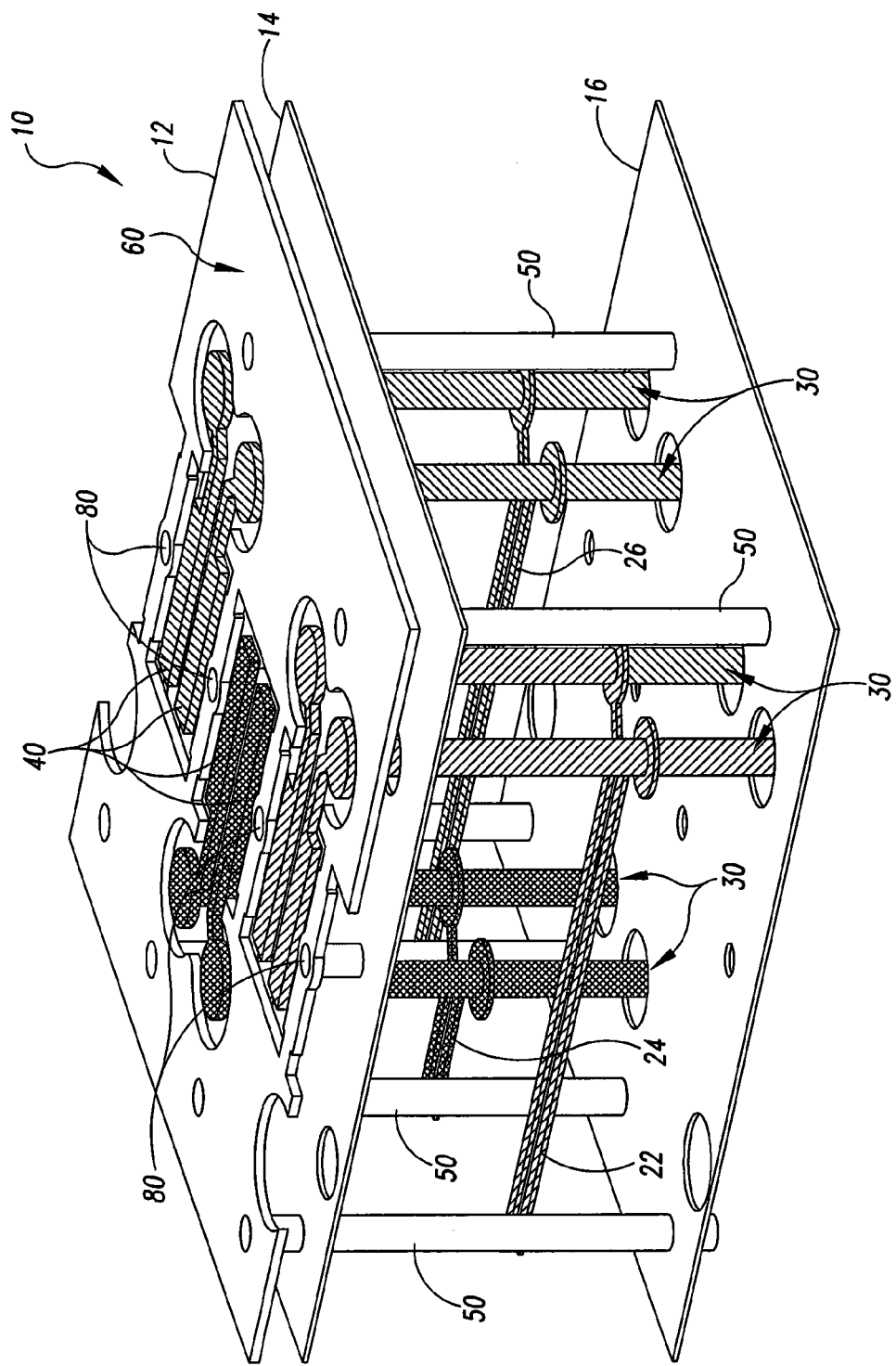
FIG. 1 is a partial isometric view of a multi-layer printed circuit board constructed in accordance with an embodiment of the disclosed technology.

FIG. 1 illustrates a partial isometric view of a multi-layer printed circuit board 10 constructed in accordance with an embodiment of the disclosed technology. The multi-layer circuit board includes an outer top layer 12 and one or more inner ground plane layers 14, 16. It will be appreciated by those skilled in the art of printed circuit board design that there are generally one or more additional layers between layers 14 and 16 such as signal layers, power layers, etc.

In the embodiment of the multi-layer printed circuit board illustrated, signals are carried differentially on the board by pairs of traces 22, 24, 26. In the embodiment shown, each of these pairs of traces is located on an inner signal layer of the multi-layer printed circuit board. Each of the individual signal traces is connected to a vertical signal via 30 that extends through the multi-layer printed circuit board, so that the signals carried on the traces can change layers in the printed circuit board.

In the embodiment shown, each of the signal vias 30 is electrically connected to a conductive landing pad 40 that is configured to engage an electrical connector (not shown), that is mounted to the multi-layer printed circuit board. In the embodiment shown, each landing pad 40 is a rectangular strip of conductive metal. The landing pads 40 are aligned in a strip along the top layer of the printed circuit board 10. In the embodiment shown, each landing pad is associated with one signal of a pair of differentially transmitted signals. The signal vias 30 are arranged on the circuit board 10 such that the signal vias 30 that connect to the landing pads 40 are alternately oriented along the length of the set of the landing pads.

To reduce cross-talk between signal traces within the printed circuit board, the printed circuit board includes a number of grounding vias 50. Each grounding via 50 is electrically coupled to a ground plane 60 on the outer layer of the multi-layer printed circuit board and one or more other ground planes located on different inner layers of the multi-layer printed circuit board. The ground plane 60 on the outer layer of the multi-layer printed circuit board also extends between the landing pads 40 that are associated with different signals. In addition, the ground plane 60 surrounds the landing pads 40 and the signal vias 30 in order to provide shielding and reduce cross-talk. Cutouts or "anti-pads" in the ground planes allow room for the different electrical contacts and the vias on each layer.

Despite the presence of the grounding vias 50 in the printed circuit board, many multi-layer printed circuit boards still exhibit some level of cross-talk between signals. In accordance with an embodiment of the disclosed technology, it has been discovered that one source of the cross-talk occurs between the adjacent landing pads 40 that are adapted to engage a connector on the printed circuit board. Despite the presence of a ground plane 60 that extends between the landing pads associated with different signal traces, cross-talk still occurs.

To further reduce cross-talk occurring between landing pads that are associated with different signals, a printed circuit board in accordance with an embodiment of the disclosed technology includes one or more micro vias 80 that are positioned between landing pads 40. Each micro via 80 is electrically coupled at one end to the ground plane 60 on an outer layer 12 of the multi-layer printed circuit board 10 and at the other end to a ground plane on an inner layer 14 of the multi-layer printed circuit board. In the embodiment shown, the inner layer 14 is adjacent to the outer layer 12. However, the micro vias 80 may extend further than two layers in the multi-layer circuit board if desired.

In the embodiment shown, the inner layer 14 that connects to an end of the micro vias 80 only contains a ground plane and does not contain any signal traces or other circuit board patterns (power pads, etc.). The ground plane lies completely underneath each of the landing pads 40 that engage a connector, thereby limiting the places where electromagnetic fields can radiate to other layers of the printed circuit board. In other embodiments, the inner layer 14 may include signal traces or other circuit board patterns if desired.

Figure 2:
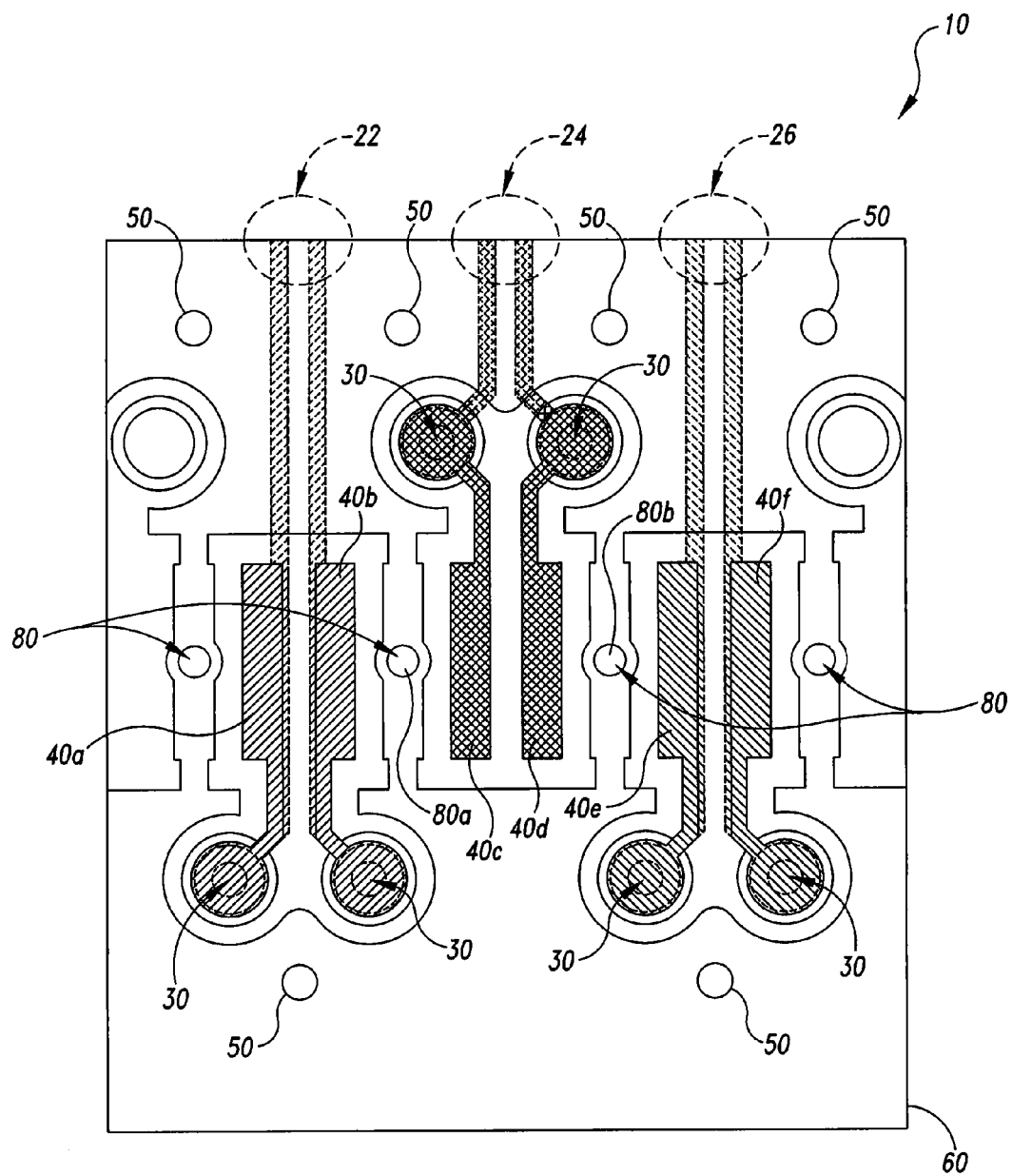
FIG. 2 is a top view of a multi-layer printed circuit board constructed in accordance with an embodiment of the disclosed technology.

FIG. 2 illustrates a top view of the multi-layer printed circuit board 10 in accordance with an embodiment of the disclosed technology. The printed circuit board 10 includes landing pads labeled 40a-40f that are associated with differential signal traces 22, 24 and 26 respectively. A micro via 80a is positioned between landing pads 40b and 40c that are associated with different signals. Similarly, a micro via 80b is placed between landing pads 40d and 40e that are associated with different signals. Also shown in FIG. 2 are the ground vias 50, which are positioned outside of the signal vias 30 that connect to the landing pads 40a-40f.

In the embodiment shown, the micro vias 80 are symmetrically placed along the length of the landing pads 40. However the micro vias 80 can also by asymmetrically placed, (i.e., off center, with respect to the landing pads). In addition, there may be more than one micro via 80 positioned between the landing pads associated with different signals.

Figure 3:
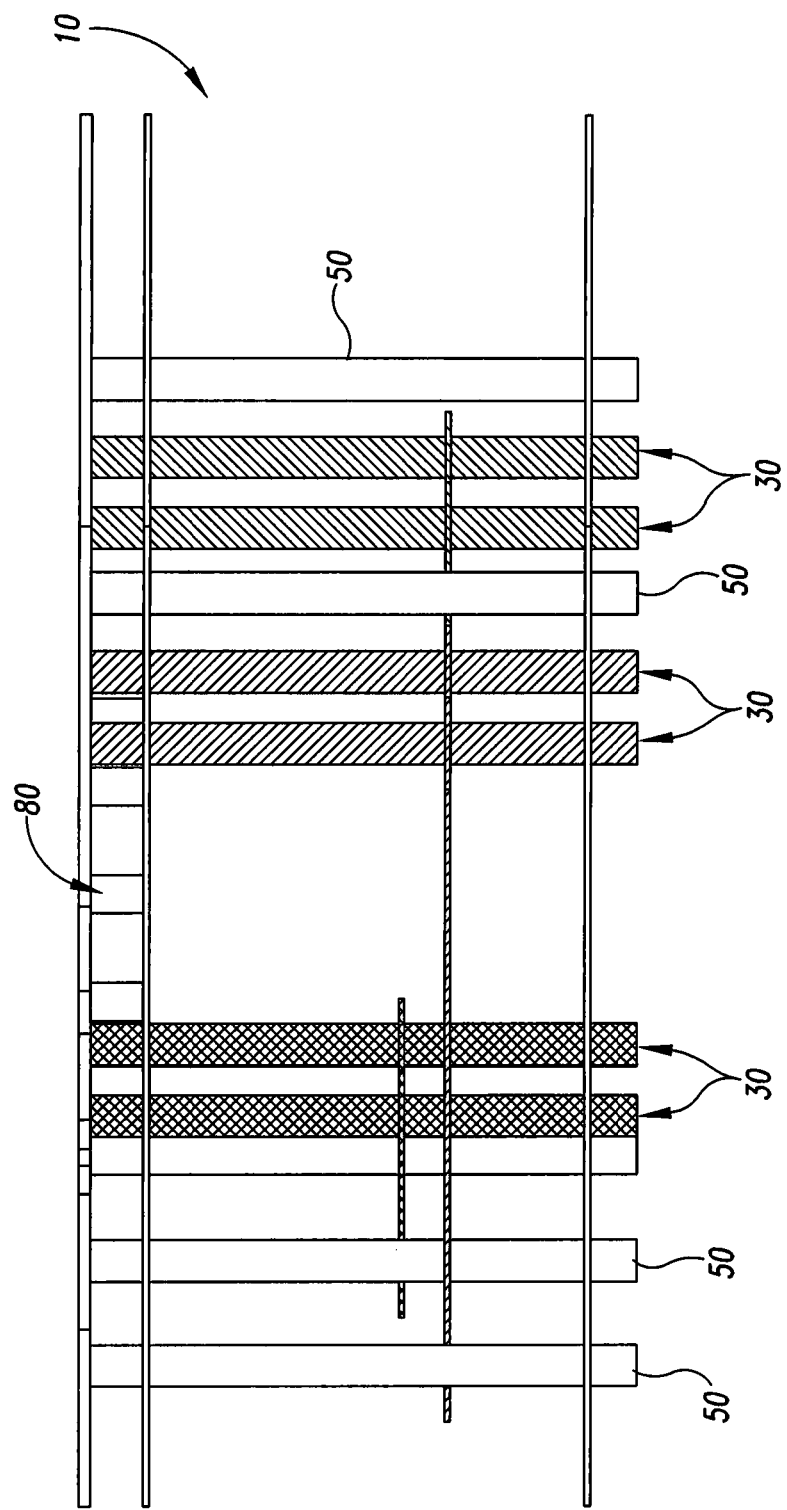
FIG. 3 is a cross-sectional view of a multi-layer printed circuit board constructed in accordance with an embodiment of the disclosed technology.

FIG. 3 illustrates a cross-section of a multi-layer printed circuit board constructed in accordance with an embodiment of the disclosed technology. The cross-section shows the difference in length between the signal vias 30, the ground vias 50 and the micro vias 80. In the embodiment shown, the ground vias 50 and the signal vias 30 extend through the entire thickness of the multi-layer printed circuit board 10. However, the micro vias 80 only extend between an outer layer of the multi-layer printed circuit board and an inner layer of the printed circuit board. In the illustrated embodiment, the micro vias 80 extend between an outer layer and a first adjacent layer of the multi-layer printed circuit board 10.

In one embodiment, the micro vias 80 are manufactured by drilling or laser-etching holes in the multi-layer printed circuit board and filling the holes with a conductive material, such as solder. In one embodiment, each micro via 80 has a diameter of approximately 0.008 inches. The circuit board is then heated to form an electrical connection between the micro vias and the ground planes on the outer and inner layers of the circuit board. Although the micro vias are shown as being round, other shapes such as; square, rectangular, triangular, hexagonal, etc., could be used if desired. With the micro vias 80 placed between the landing pads 40 associated with different signals, computer modeling has shown a reduction of cross-talk between adjacent signals by an additional −15 dB at 4 GHz, compared with a printed circuit without the micro vias.

Although the disclosed embodiment illustrates a circuit board with landing pads 40 for use with a connector that carries differential signals, it will be appreciated that the disclosed technology can also be used to reduce cross-talk between landing pads associated with connectors for single-ended signals. In this case, one or more micro vias can be placed between each landing pad that is associated with a different signal.

In one embodiment, the connector that is coupled to the landing pads 40 on the outer surface of the multi-layer circuit board 10 is a QSH/QTH high-speed socket connector produced by Samtec, or the like. However, it will be appreciated that other types of connectors associated with other shapes or configurations of landing pads could also benefit from the micro vias placed between the landing pads.

From the foregoing, it will be appreciated that specific embodiments of the invention have been described herein for purposes of illustration, but that various modifications may be made without deviating from the spirit and scope of the invention. For example, other configurations of shielding structures such as, conductive slats, sheets, or the like, can be placed between the landing pads that connect to a circuit board connector. Accordingly, the invention is not limited, except as by the appended claims.

We claim:

1. A multi-layer printed circuit board, comprising: a multi-layer board having a number of conductive traces for carrying signals and one or more ground planes that are connected by a number of conductive grounding vias; wherein the printed circuit board includes a series of conductive landing pads on an outer layer of the printed board that are configured to electrically engage contacts of a socket connector mounted on the printed circuit board and further includes one or more micro vias positioned between landing pads associated with different signals, wherein each micro via is electrically connected to a ground plane on the outer layer of the printed circuit board and a ground plane on an inner layer of the printed circuit board, wherein signals are carried differentially on a pair of traces, such that there are two landing pads for each signal that is electrically coupled to the connector, and wherein each micro via is positioned between the two landing pads associated with different signals, wherein the landing pads are aligned and the micro vias are symmetrically placed between the landing pads associated with different signals.

2. The multi-layer printed circuit board of claim 1, wherein the micro vias extend between an outer layer of the printed circuit board and an adjacent layer of the printed circuit board.

3. The multi-layer printed circuit board of claim 1, wherein the micro vias extend between an outer layer of the printed circuit board and a non-adjacent layer of the printed circuit board.

4. The multi-layer printed circuit board of claim 1, wherein the ground plane on the inner layer of the printed circuit board lies underneath the landing pads that engage a connector.

5. a multi-layer printed circuit board, comprising: a plurality of circuit board layers including an outer layer with landing pads thereon that are connectable to a circuit board connector; one or more circuit traces on which signals are routed to different landing pads; and one or more shielding structures positioned between the landing pads associated with different signals, wherein each shielding structure is electrically connected to a ground plane on the outer layer of the circuit board and to a ground plane on an inner layer of the circuit board, wherein signals are carried differentially on a pair of traces, such that there are two landing pads for each signal that is electrically coupled to the connector, and wherein each micro via is positioned between the two landing pads associated with different signals.

6. The multi-layer printed circuit board of claim 5, wherein the shielding structures are micro vias.

7. A multi-layer printed circuit board, comprising:
a plurality of circuit board layers including an outer layer with landing pads thereon that are connectable to a circuit board connector that carries differentially transmitted signals such that there are two landing pads for each signal to be transmitted;
a ground plane on the outer layer of the printed circuit board that extends between the landing pads associated with different signals to be transmitted;
one or more circuit traces on which signals are routed to different landing pads; and
one or more micro vias positioned between the landing pads associated with different signals, wherein each micro via is electrically connected to the ground plane on the outer layer of the printed circuit board.

* * * * *

UNITED STATES PATENT AND TRADEMARK OFFICE
CERTIFICATE OF CORRECTION

PATENT NO. : 8,885,357 B2
APPLICATION NO. : 13/345247
DATED : November 11, 2014
INVENTOR(S) : Hyunjun Kim et al.

It is certified that error appears in the above-identified patent and that said Letters Patent is hereby corrected as shown below:

In the Claims

In column 4, line 49, in claim 5, delete "a multi-layer" and insert -- A multi-layer --, therefor.

Signed and Sealed this
Twenty-first Day of April, 2015

Michelle K. Lee
*Director of the United States Patent and Trademark Office*